(12) United States Patent
Kupla et al.

(10) Patent No.: US 7,106,600 B2
(45) Date of Patent: Sep. 12, 2006

(54) INTERPOSER DEVICE

(75) Inventors: William G. Kupla, Lakeway, TX (US); Jeffrey Gruger, Austin, TX (US)

(73) Assignee: Newisys, Inc., Austin, TX (US)

( * ) Notice: Subject to any disclaimer, the term of this patent is extended or adjusted under 35 U.S.C. 154(b) by 267 days.

(21) Appl. No.: 10/835,802

(22) Filed: Apr. 29, 2004

(65) Prior Publication Data

US 2005/0243531 A1    Nov. 3, 2005

(51) Int. Cl.
*H05K 7/06* (2006.01)
*G06F 3/00* (2006.01)

(52) U.S. Cl. .................. 361/783; 361/780; 361/794; 361/803; 257/723; 712/32

(58) Field of Classification Search .............. None
See application file for complete search history.

(56) References Cited

U.S. PATENT DOCUMENTS

| | | | | |
|---|---|---|---|---|
| 5,737,579 A | * | 4/1998 | Kimura et al. ............. 703/26 |
| 6,118,670 A | * | 9/2000 | Radford et al. ............. 361/777 |
| 6,144,559 A | * | 11/2000 | Johnson et al. ............. 361/760 |
| 6,205,532 B1 | * | 3/2001 | Carvey et al. ............. 712/1 |
| 6,842,347 B1 | * | 1/2005 | Chang ............. 361/780 |
| 2003/0037224 A1 | | 2/2003 | Oehler et al. ............. 712/29 |
| 2004/0257781 A1 | | 12/2004 | Record et al. ............. 361/788 |

* cited by examiner

*Primary Examiner*—John B. Vigushin
(74) *Attorney, Agent, or Firm*—Beyer Weaver & Thomas LLP

(57) ABSTRACT

The present invention provides devices and techniques for replacing at least one processor in a multi-processor computer system with an interposer device that maintains at least some of the input/output ("I/O") connectivity of the replaced processor or processors. Layers of the interposer device may be configured to match the corresponding layers of the motherboard to which the processors and interposer device are attached. According to some implementations of the invention, the power system of the motherboard is altered to allow a voltage regulator that powers a link between a processor and the interposer device to also power a link between the interposer device and an I/O device.

13 Claims, 6 Drawing Sheets

| STACKUP TABLE | | | 5 | |
|---|---|---|---|---|
| LAYER | DESCRIPTION | FINISHED Cu WEIGHT (oz.) | | ESTIMATED THICKNESS (mls) | |
| 1 | TOP | 1.5 | 29 | 2.1 | 29 |
| PREPREG | | | | 4.0 | |
| 2 | PLANE | 2.0 | | 2.8 | |
| CORE | | | | 7.0 | |
| 3 | INNER 1 | 0.5 | | 0.7 | |
| PREPREG | | | | 7.0 | |
| 4 | PLANE | 2.0 | | 2.8 | |
| CORE | | | | 7.0 | |
| 5 | INNER 2 | 0.5 | | 0.7 | |
| PREPREG | | | | 7.0 | |
| 6 | PLANE | 2.0 | | 2.8 | |
| CORE | | | | 5.0 | 31 |
| 7 | PLANE | 2.0 | | 2.8 | |
| PREPREG | | | | 7.0 | |
| 8 | INNER 3 | 0.5 | | 0.7 | |
| CORE | | | | 7.0 | |
| 9 | PLANE | 2.0 | | 2.8 | |
| PREPREG | | | | 7.0 | |
| 10 | INNER 4 | 0.5 | | 0.7 | |
| CORE | | | | 7.0 | |
| 11 | PLANE | 2.0 | | 2.8 | |
| PREPREG | | | | 4.0 | |
| 12 | BOTTOM | 1.5 | 29 | 2.1 | 29 |
| DIELECTRIC | | | | FR-4 | 5 |

*Fig. 5*

INTERPOSER DEVICE

BACKGROUND OF THE INVENTION

The present invention relates generally to multi-processor computer systems. A relatively new approach to the design of multi-processor systems replaces broadcast communication such as bus or ring architectures among processors with a point-to-point data transfer mechanism in which the processors communicate similarly to network nodes in a tightly-coupled computing system. That is, the processors are interconnected via a plurality of communication links and requests are transferred among the processors over the links according to routing tables associated with each processor. The intent is to increase the amount of information transmitted within a multi-processor platform per unit time.

In some multi-processor systems, local nodes (including processors, input/output (I/O) devices, etc.) are directly connected to each other through a plurality of point-to-point intra-cluster links to form a cluster of two or more processors. The point-to-point links significantly increase the bandwidth for coprocessing and multiprocessing functions.

However, it is sometimes desirable to eliminate one or more of the processors in a cluster designed for multiple processors. For example, some customers will not require the processing capabilities of all processors and may prefer a lower-cost machine having fewer processors. Such customers will generally want to maintain all of the I/O capability of a machine with a full complement of processors. Therefore, it would be desirable to provide techniques for reducing the number of processors on a motherboard designed to accommodate multiple processors, while maintaining most or all of the input/output capability of the original design.

SUMMARY OF THE INVENTION

The present invention provides devices and techniques for replacing at least one processor in a multi-processor computer system with an interposer device that maintains at least some of the input/output ("I/O") connectivity of the replaced processor or processors. Layers of the interposer device may be configured to match the corresponding layers of the motherboard to which the processors and interposer device are attached. According to some implementations of the invention, the power system of the motherboard is altered to allow a voltage regulator that powers a link between a processor and the interposer device to also power a link between the interposer device and an I/O device.

Some embodiments of the invention provide an interposer device that includes a plurality of layers having transmission characteristics that are substantially identical to transmission characteristics of layers in a motherboard. The motherboard is configured to accommodate at least two processors in a point-to-point architecture. The interposer device is configured to be disposed in a first socket of the motherboard made to accommodate a first processor and is configured to transmit signals between a second processor attached to the motherboard and an input/output device attached to the motherboard. In some implementations, the signals are Hyper Transport signals.

The interposer device may include a plurality of pins configured to be disposed in a pin field of the first socket. Each of the plurality of pins may be configured to conduct signals between an interposer device layer and a corresponding motherboard layer. The pin field may include a first recess configured to receive a first pin of the first processor, thereby activating a first voltage regulator. Preferably, no pin of the interposer device is configured to be received by the first recess when the interposer device is properly disposed within the first socket. The interposer device may be configured to cause a voltage regulator that controls power on a first link between the interposer device and the second processor to also control power on a second link between the interposer device and the input/output device.

Some implementations of the invention provide a method of manufacturing at least a portion of a computing device. The method includes the following steps: configuring a plurality of sockets of a motherboard to receive a plurality of nodes, including processors and input/output devices; disposing a first processor in a first socket of the motherboard configured to receive the first processor; disposing an input/output device in a second socket of the motherboard configured to receive the input/output device; and disposing an interposer device in a third socket of the motherboard configured to receive a second processor, thereby conducting signals between the first processor and the input/output device through the interposer device with transmission characteristics that are substantially identical to transmission characteristics of a motherboard.

For implementations in which the motherboard includes a plurality of voltage regulators for regulating voltage on a plurality of links between the nodes, the method may also include the step of disabling one of the plurality of voltage regulators that controls voltage on a link between the second socket and the third socket.

Alternative embodiments of the invention provide a computing device. The computing device includes a motherboard having a plurality of sockets to receive a plurality of nodes, including processors and input/output devices, and a plurality of links for communication between the nodes. The computing device also includes: a first processor disposed in a first socket of the motherboard; an input/output device disposed in a second socket of the motherboard; and an interposer device in a third socket of the motherboard. The interposer device is configured to conduct signals between the first processor and the input/output device. The interposer device has layers with transmission characteristics that match transmission characteristics of corresponding layers of the motherboard.

The motherboard may include a plurality of voltage regulators, each voltage regulator configured to control power in a power domain. If so, the interposer device is further configured to enable one of the plurality of voltage regulators to extend its power domain.

Still other embodiments of the present invention provide an interposer device having a plurality of layers. Each layer of the interposer device substantially corresponds to a layer of a motherboard configured to accommodate at least two processors in a point-to-point architecture. The interposer device is configured to be positioned in a first socket of the motherboard made to accommodate a first processor. The interposer device is configured to transmit signals between a second processor attached to the motherboard and an input/output device attached to the motherboard.

A further understanding of the nature and advantages of the present invention may be realized by reference to the remaining portions of the specification and the drawings.

BRIEF DESCRIPTION OF THE DRAWINGS

FIG. 5 is a table indicating layers of the motherboard of FIG. 4.

DETAILED DESCRIPTION OF SPECIFIC EMBODIMENTS

Figure 1:
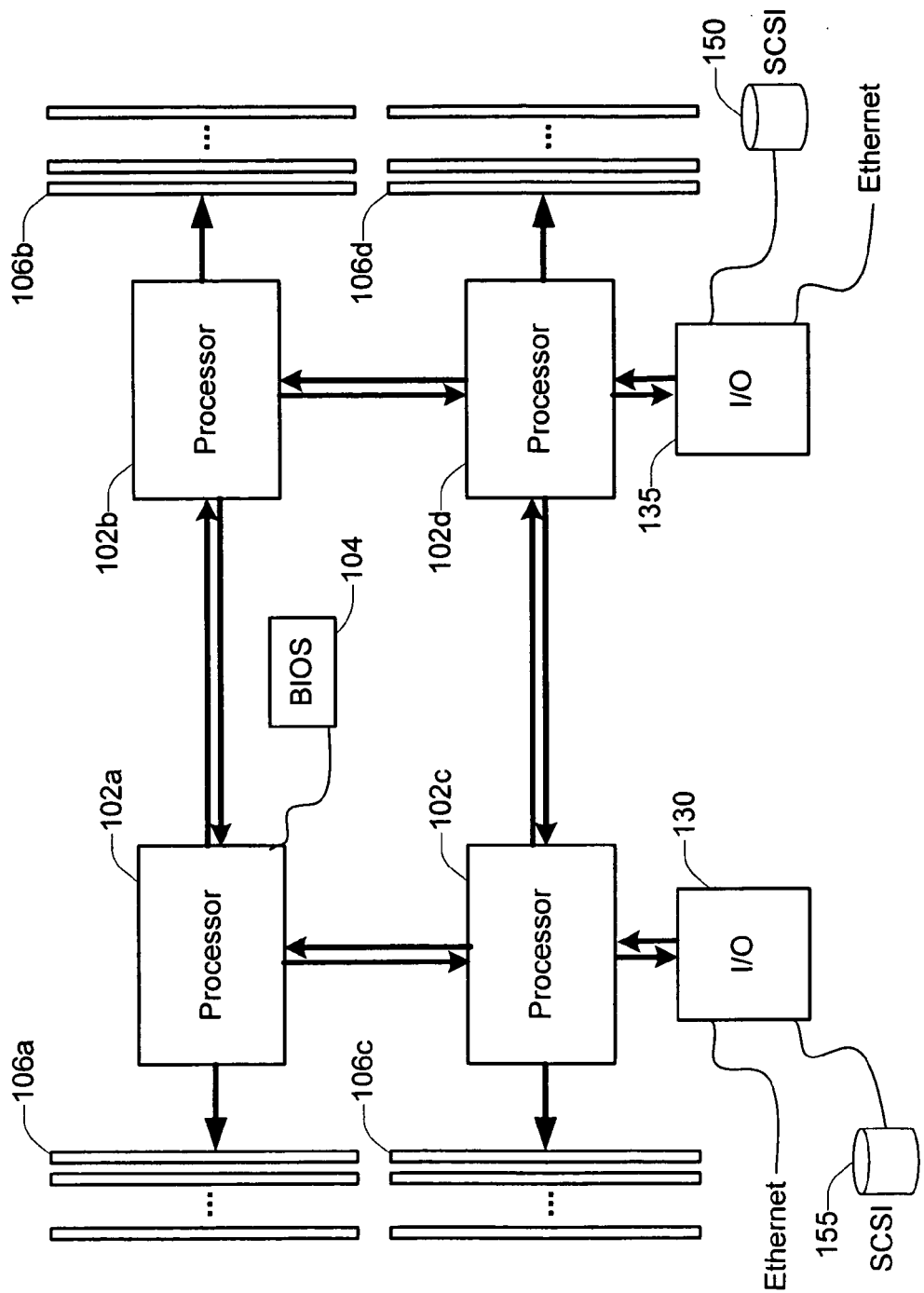
FIG. 1 is a diagrammatic representation of an exemplary cluster having a plurality of processors.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

Multi-processor architectures having point-to-point communication among their processors are suitable for implementing specific embodiments of the present invention. In the following description, numerous specific details are set forth in order to provide a thorough understanding of the present invention. The present invention may be practiced without some or all of these specific details. Well-known process operations have not been described in detail in order not to obscure the present invention. Furthermore, the present application's reference to a particular singular entity includes that possibility that the methods and apparatus of the present invention can be implemented using more than one entity, unless the context clearly dictates otherwise.

It is sometimes desirable to use fewer than the maximum number of processors for which a motherboard is designed. For example, in computers having a motherboard designed for 4 processors, the performance may be satisfactory for most customers if only 3 of the 4 processors are actually installed. Similarly, in computers having a motherboard designed for 2 processors, the performance may be satisfactory if only 1 of the 2 processors is installed.

Therefore, the present invention provides devices and techniques for replacing at least one processor in a multi-processor computer system with an interposer device that maintains at least some of the I/O connectivity of the replaced processor or processors. In the following paragraphs, the basic layout and functions of some multi-processor systems will be described. Thereafter, an exemplary interposer device will be described. Moreover, some methods will be described for replacing one of the processors in a multi-processor system with an interposer device.

Some multi-processor systems replace broadcast communication among nodes with a point-to-point data transfer mechanism in which the nodes communicate similarly to network nodes in a distributed computing system, e.g., a wide area network. That is, the processors and I/O devices are interconnected via a plurality of communication links. Requests are transferred among the nodes over the links according to routing tables associated with each processor. The intent is to increase the amount of information transmitted within a multi-processor platform per unit time. An example of this approach is the HyperTransport (HT) architecture designed by Advanced Micro Devices Inc. (AMD) of Sunnyvale, Calif., and described, for example, in a paper entitled *HyperTransport™ Technology: A High-Bandwidth, Low-Complexity Bus Architecture* delivered at WinHEC 2001, Mar. 26–28, 2001, at Anaheim, Calif., the entirety of which is incorporated herein by reference for all purposes. HT communication will be described below with reference to FIG. 3.

The operation of an exemplary multi-processor system will now be described with reference to the simplified block diagram of FIG. 1. In this example, system 100 includes 4 processors. However, it will be appreciated by those of skill in the art that alternative embodiments can include more or fewer processors. Moreover, most of the resources shown in FIG. 1 reside on a single electronic assembly or "motherboard," though this is not the case in all embodiments.

Each time system 100 boots up, the routing tables associated with each of processors 102a–102d are initialized. The initialization process is controlled by BIOS 104, which may be any persistent memory (e.g., flash memory). The primary processor 102a, i.e., the one communicating with BIOS 104, starts up while the remaining processors are not running. For the sake of simplicity, FIG. 1 indicates that BIOS 104 is directly attached to primary processor 102a. However, those of skill in the art will understand that BIOS 104 will typically be attached to primary processor 102a via an I/O chain.

Primary processor 102a then executes a "discovery" algorithm that builds up the routing tables in each of the processors using the HT infrastructure. This algorithm is a "greedy" algorithm that attempts to capture all of the available or "reachable" system resources and build a single, undivided system from the captured resources.

Primary processor 102a begins this process by identifying all system resources that are responsive to it, i.e., all of the adjacencies. Then, for each such resource (e.g., memory bank 106a and processors 102b and 102c), primary processor 102a requests all of the resources responsive to (i.e., "owned by") that resource (e.g., memory banks 106b and 106c). Using this information, the primary processor builds the routing tables. In this example, memory banks 106a–106d comprise double data rate (DDR) memory that is physically provided as dual in-line memory modules (DIMMs).

System 100 also includes various input/output ("I/O") devices, as exemplified by I/O devices 130 and 135 of FIG. 1, which are directly connected to processors 102c and 102d, respectively. In some embodiments, processors 102a and 102b are directly connected to other I/O devices. I/O devices 130 and 135 may be, for example, Ethernet cards adapted to provide communications with a network such as, for example, a local area network (LAN) or the Internet. I/O devices 130 and 135 include a controller (e.g., an ultra direct memory access (UDMA) controller or a small computer system interface (SCSI) controller) that provides access to a permanent storage device. Accordingly, I/O devices 130 and 135 allow system 100 to read and write data to storage devices 150 and 155 and to communicate with other systems (here, via an Ethernet connection).

Figure 2:
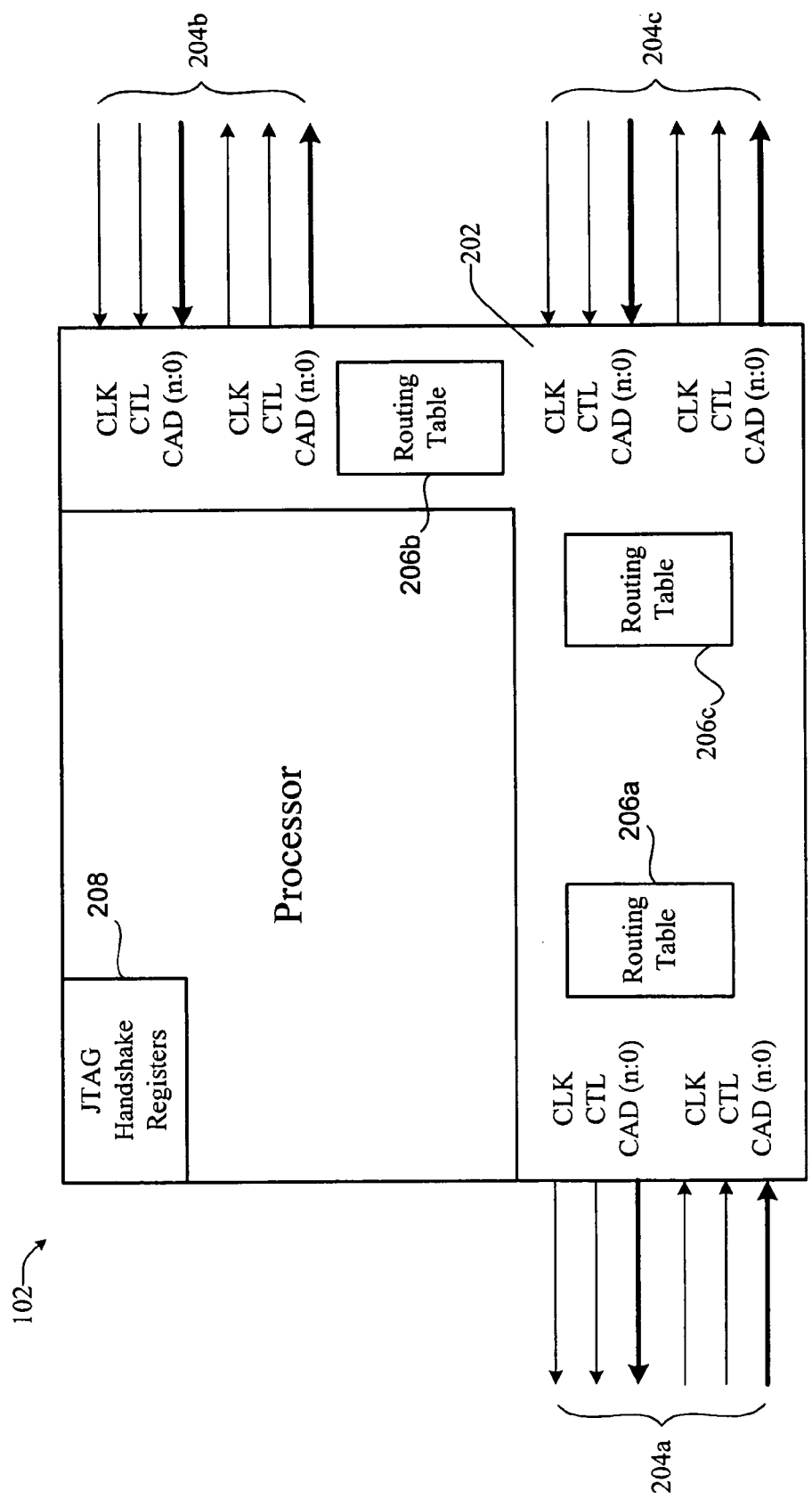
FIG. 2 is a diagrammatic representation of a processor.

FIG. 2 is a simplified block diagram of a processor 102 that includes an interface 202 having a plurality of ports 204a–204c and routing tables 206a–206c associated therewith. Each port 204 allows communication with other resources, e.g., processors or I/O devices, in the computer system via associated links.

The infrastructure shown in FIG. 2 can be generalized as a point-to-point, distributed routing mechanism that comprises a plurality of segments interconnecting the system's processors according to any of a variety of topologies, e.g., ring, mesh, etc. Each of the endpoints of each of the segments is associated with a connected processor that has a unique node ID and a plurality of associated resources that it "owns," e.g., the memory and I/O to which it is connected.

The routing tables associated with each of the nodes in the distributed routing mechanism collectively represent the current state of interconnection among the computer system resources. Each of the resources (e.g., a specific memory range or I/O device) owned by any given node (e.g., processor) is represented in the routing table(s) associated with the node as an address. When a request arrives at a node, the requested address is compared to a two-level entry in the node's routing table identifying the appropriate node and link, i.e., given a particular address within a range of addresses, go to node x; and for node x use link y. As shown in FIG. 2, a processor 102 can conduct point-to-point communication with the other processors according to the information in the associated routing tables. In some implementations, routing tables 206a–206c comprise two-level tables, a first level associating the unique addresses of system resources (e.g., a memory bank) with a corresponding node (e.g., one of the processors), and a second level associating each node with the link to be used to reach the node from the current node.

Processor 102 also has a set of JTAG handshake registers 208 which, among other things, facilitate communication between an external device, e.g., a service processor or piece of test equipment and processor 102. That is, such a service processor can write routing table entries to handshake registers 208 for eventual storage in routing tables 206a–206c. It should be understood that the processor architecture depicted in FIG. 2 is merely exemplary and is presented for the purpose of describing a specific embodiment of the present invention. For example, a fewer or greater number of ports and/or routing tables may be used to implement other embodiments of the invention.

Although the present invention may be implemented in any system having a point-to-point architecture, the Hyper-Transport ("HT") protocol is widely used to provide for the orderly and efficient communication of probes and responses in multi-processor systems. Therefore, in order to appreciate more fully how the interposer device operates, a brief description of the HT protocol is set forth in the following paragraphs.

Figure 3:
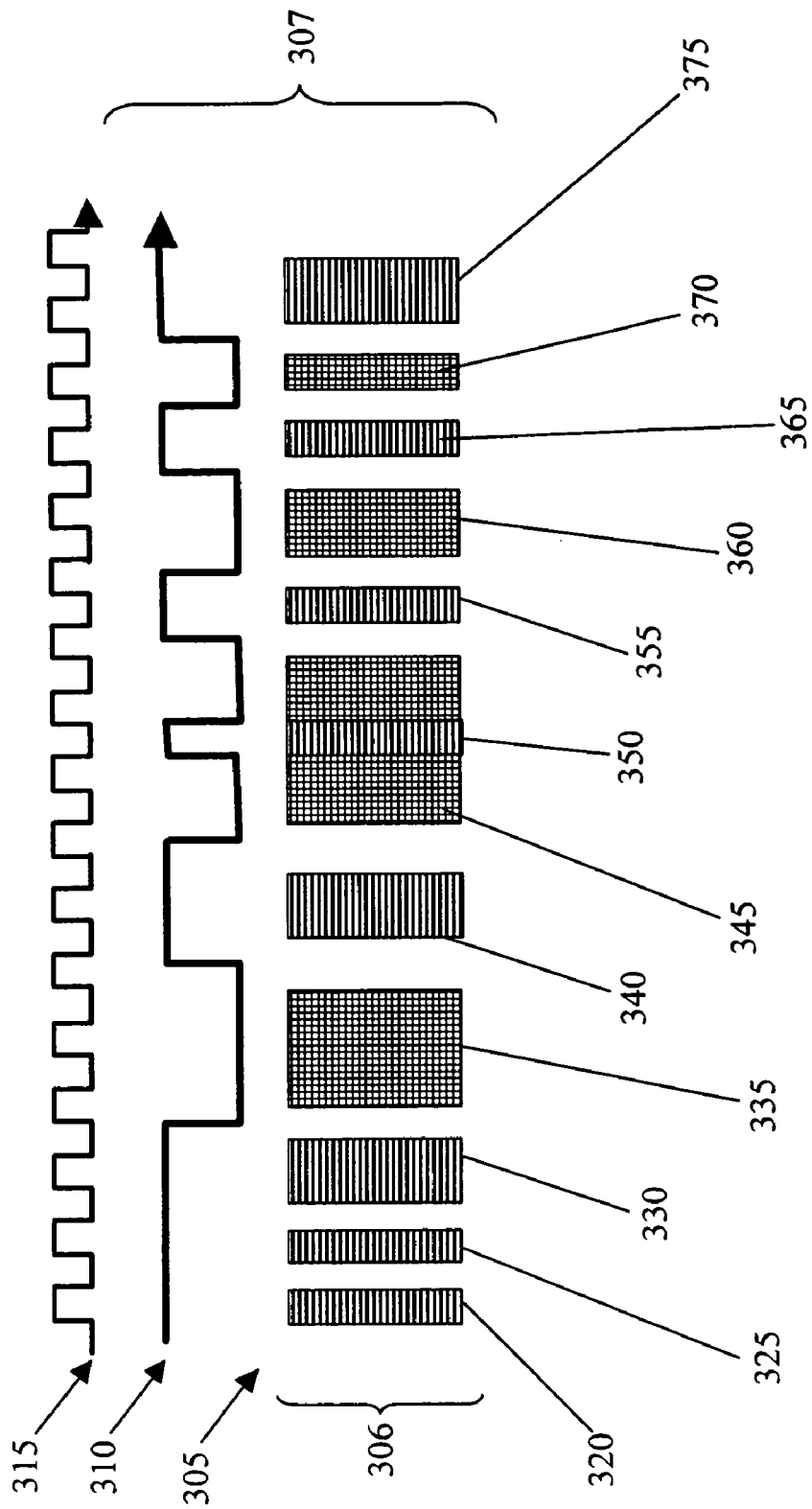
FIG. 3 is representation of a Hyper Transport signal.

According to the HT protocol, there are three basic types of signals, which are illustrated in FIG. 3. The first type is "CAD" (command, address, data) signal 305, which is a multiplexed signal carrying "control" (request, response, information) signals and data signals. The second type is CNTL signal 310, which differentiates between control and data signals. Some implementations include more than one data lane dedicated to CNTL signals. The third type of signal is CLK signal 315. Data are transmitted (or received) at both edges of CLK signal 315. For the sake of simplicity, FIG. 3 indicates signals traveling in a single direction, but signals normally travel in both directions on an HT link.

The control information and data of CAD signal 305 are formed into packets, in multiples of 32 bits. Control packets are 32 bits long (such as packets 320 and 325) or 64 bits long (such as packet 330). Data packets range in length from 32 bits (e.g., packet 370) to 512 bits. The HT protocol allows a control packet to be sent within a data packet. For example, data packets 335 and 345 are both 128 bits long, but control packet 150 is transmitted after data packet 345 started and before data packet 345 ended.

Data path 306 may be 2, 4, 8, 16 or 32 bits wide. If data path 306 is narrower than 32 bits, successive "bit-times" are used to complete the transfer of a packet. For example, if CAD signal 305 is carried on an 8-bit wide link, 4 bit-times would be required to complete the transfer of 32-bit control packet 320.

CTL signal 310 differentiates control packets from data packets. When CTL signal 310 is high (a "1"), this condition indicates that a control packet (or a portion of a control packet) is being transferred in parallel with CTL signal 310. Accordingly, CTL signal 310 of FIG. 3 is high when control packets 320, 325, 330, 340, 350, 355, 365 and 375 are transmitted. When CTL signal 310 is low (a "0"), this condition indicates that some or all of a data packet is being transferred in parallel with CTL signal 310. Therefore, CTL signal 310 of FIG. 3 is low when data packets 335, 345, 360 and 370 are transmitted. CTL signal 310 requires 1 bit per bit-time.

CLK signal 315 helps to keep CAD signal 305 and CNTL signal 310 synchronized. If CAD signal 305 is transmitted on a data path of 8 bits or less, one CLK signal 315 is transmitted in parallel with CAD signal 305. If CAD signal 305 is transmitted on a data path greater than 8 bits in size, more than one CLK signal 315 is preferably transmitted.

In the example shown in FIG. 3, data path 306 is 8 bits wide. CNTL signal 310 and CLK signal each require a 1-bit data lane. Accordingly, link 307 is 10 bits wide. However, as noted above, many other link widths are possible.

In various implementations of the invention, one or more of processors 102 of system 100 (or a similar multi-processor system) are replaced by a device referred to herein as an "interposer device." This may be desirable, for example, in order to reduce the overall cost of the system for applications that do not require as many processors. When one or more processors 102 are omitted, it is desirable to maintain the connections between the remaining processors and any or all of the I/O devices associated with the omitted processor(s). The interposer device of the present invention provides this functionality.

Figure 4:
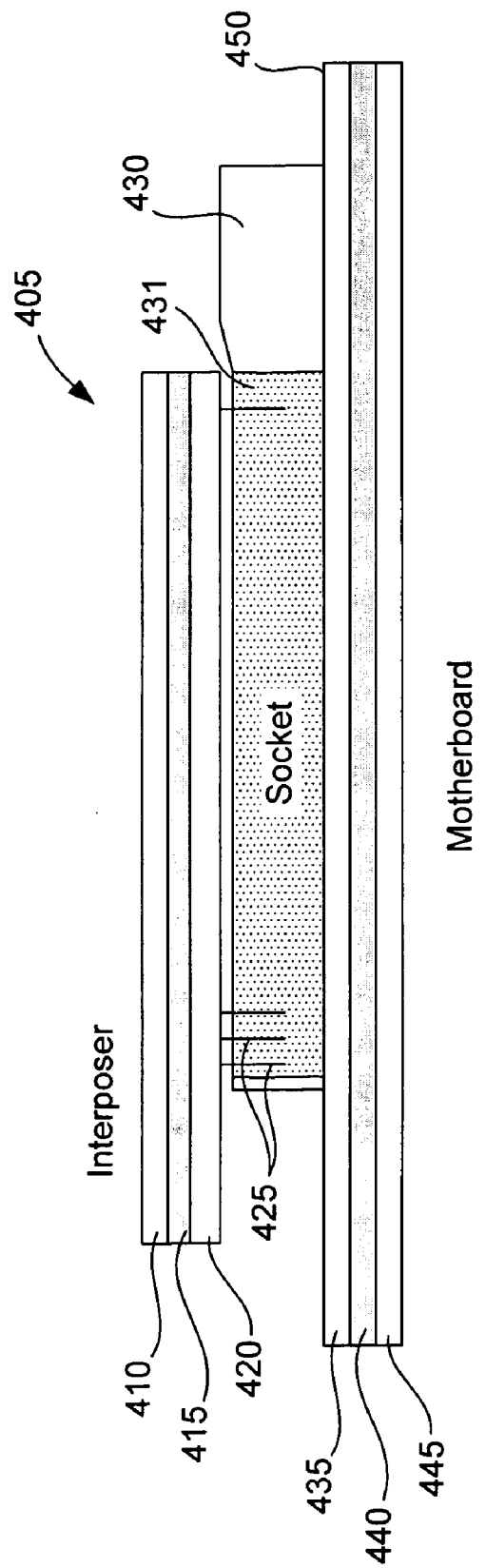
FIG. 4 is a schematic cross-section of an interposer device attached to a motherboard according to an embodiment of the present invention.

A simplified version of an interposer device is depicted in FIG. 4. In this embodiment, interposer device 405 includes layers 410, 415 and 420 that are substantially identical to the "board stackup" of motherboard 450, which is schematically depicted as layers 435, 440 and 445. It will be appreciated by those of skill in the art that motherboard 450 would typically include many more layers than are depicted in FIG. 4, including wiring layers, power plane layers and ground layers, separated by insulating layers. FIG. 5, described below, is a stackup table indicating a more realistic depiction of the layers of an interposer device according to this embodiment.

Pins 425 of interposer device 405 fit into pin field 431 of socket 430, thereby establishing data and power connections between one or more nearby processors and one or more I/O devices. The number and lengths of pins 425 shown in FIG. 4 are purely illustrative; in practice, many more pins would typically be used. Pins 425 convey signals, power, etc., between the planes of interposer device 405 and the corresponding planes of motherboard 450, thereby allowing communication between adjacent point-to-point links. For each connection between interposer device 405 and the corresponding planes of motherboard 450, there are two pins. Each pin conveys a signal from motherboard 450 to interposer device 405, or vice versa. A signal approaching interposer device 405 in a plane of motherboard 450 would be conveyed from motherboard 450 to a corresponding plane of interposer device 405 via a first pin, would traverse the corresponding plane of interposer device 405 and would then be conveyed back to the original plane of motherboard 450 by the second pin.

According to a specific embodiment, the signals traversing interposer device 405 are referenced to the same power plane as they are in the motherboard on the adjacent point-to-point links. Matching the board stackup of interposer device 405 with that of motherboard 450 allows the characteristic impedance of the interposer device's layers to match those of motherboard 450. Accordingly, the transmission characteristics of the signals traversing interposer device 405 should be the same as if the signals had merely continued through motherboard 450. The net result is that the adjacent point-to-point links are effectively a single link, viewed from the perspective of, for example, a processor and an I/O device at the ends of this link. These connections will be described below in the context of a motherboard layout, with reference to FIG. 6.

FIG. 5 is a stackup table that indicates the thickness and composition of one embodiment of interposer device 405. The numbered layers 1 through 12 are conducting layers, which are made of copper in this embodiment. The layers labeled "PREPREG" and "CORE" are insulating layers disposed between the conducting layers. As will be appreciated by those of skill in the art, this material is an epoxy glass laminate, which in this embodiment is NEMA grade FR-4. Those of skill in the art will also realize that other materials may be substituted for the insulating and conducting layers described herein. The thickness in mils is shown for each layer and the finished weight of each conducting layer is indicated.

Some of the conducting layers may contain trace sets with several different targeted impedances. For example, in one embodiment, layers 3, 5, 8 and 10 need to have impedances of 100 ohms, plus or minus 10 ohms. The thicknesses shown apply after masking and plating. For example, the thicknesses of conducting layers 1 and 12 include material added during a plating process. The thickness of the CORE layer between conducting layers 6 and 7 is provided only by way of example. This thickness may be varied as needed to meet the overall thickness required for interposer device 405.

However, other embodiments of interposer device 405 do not include layers that are substantially identical to the board stackup of motherboard 450. For example, some embodiments of interposer device 405 are similar to the embodiment depicted above, but include a sequence of layers that is inverted or otherwise changed with respect to the layers of motherboard 450. Alternative embodiments of interposer device 405 include layers having transmission characteristics that are substantially similar to those of the signal layers of motherboard 450, but which are constructed using, e.g., semiconductor fabrication techniques. All such interposer devices, and equivalents thereto, are within the scope of the present invention.

Figure 6:
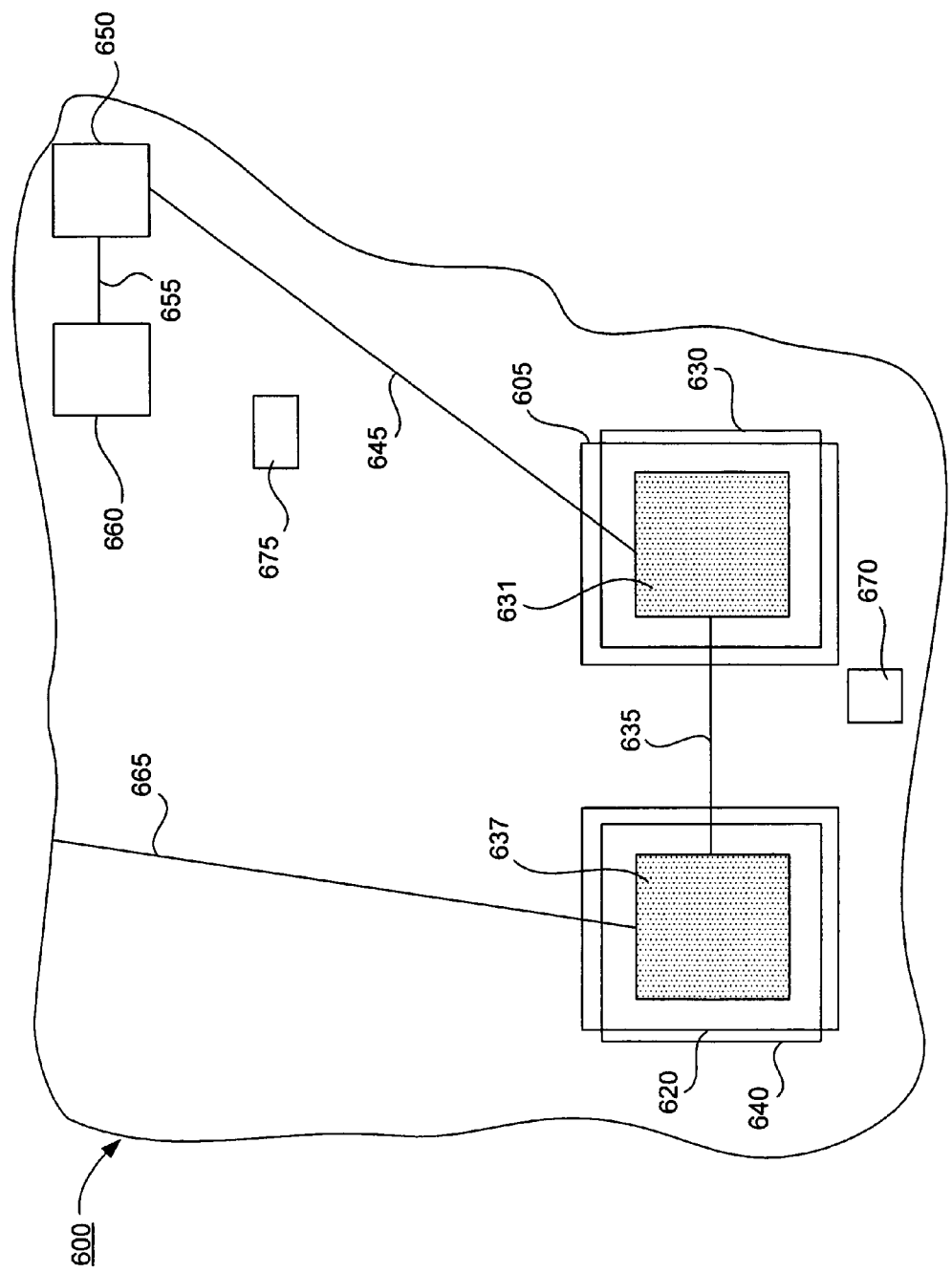
FIG. 6 is a diagrammatic representation of a motherboard that may be used with various embodiments of the present invention.

FIG. 6 is a top view of a motherboard layout for implementing one embodiment of the present invention. Socket keep-out 630 is designed to accommodate a socket for a processor that would fit into area 620. Pins of the processor would fit into pin field 637 to establish connections between the processor and other components of motherboard 600. Pin fields 650 and 660 are configured to receive pins from I/O devices.

Interposer device 405 (or an additional processor) would fit into area 605. Socket 430 would fit into socket keep-out 630. Pins 425 of interposer device 405 would fit into pin field 631.

Point-to-point link 635 (which is an HT link in this example) connects pin fields 631 and 637. As will be appreciated by those of skill in the art, point-to-point links 635, 645, 655 and 665 are schematic representations of a plurality of traces within motherboard 600 that form these point-to-point links. In one exemplary embodiment, point-to-point links 635, 645, 655 and 665 each represent 2 point-to-point interconnects, each point-to-point interconnect including 16 data signals, 2 clock signals and a command signal. Two wires are needed to transmit each signal. Therefore, according to this embodiment a total of 38 wires is required for each point-to-point interconnect, making a total of 76 wires for each point-to-point link.

In this implementation, motherboard 600 is configured for multiple voltage regulators. Voltage regulator 670 is configured to control the voltage on point-to-point link 635. Voltage regulator 675 is configured to control the voltage on point-to-point link 645. The areas in which voltage is controlled by a particular voltage regulator will be referred to herein as "power domains." The power domains include the interfaces at the sending and receiving chips. For example, when a processor is installed in pin field 631 and an I/O chip is installed in pin field 650, the power domain of voltage regulator 675 includes the drivers and receivers of the processor and the I/O chip.

According to some implementations, signals are transmitted on the point-to-point links according to low-voltage differential signaling ("LVDS"). LVDS is a low-noise, low-power, low-amplitude method for high-speed (gigabits per second) data transmission over copper wire. LVDS differs from normal digital I/O, which works with 5 volts as a high (binary 1) and 0 volts as a low (binary 0). Differential signaling includes a third option (e.g., −5 volts), which provides an extra level with which to encode and results in a higher maximum data transfer rate. "Low voltage" means that the standard 5-volt signal used to represent a binary 1 is replaced by a signal at either 3.3 volts or 1.5 volts. With standard I/O signaling, data storage is contingent upon the actual voltage level, which can be affected by wire length. With LVDS, data storage is distinguished only by positive and negative voltage values, not the voltage level. Therefore, data can travel over greater lengths of wire while maintaining a clear and consistent data stream. One of skill in the art will appreciate that signaling methods other than LVDS may be used.

According to some implementations for motherboards having distributed voltage regulators (such as motherboard 600), inserting a pin into a designated recess of pin field 631 would activate voltage regulator 675. Having voltage regulator 675 activated is appropriate when a processor is fit into pin field 631 instead of interposer device 405, because the processor would not merely be transmitting data from point-to-point link 635 to point-to-point link 645, but instead would be sending and receiving data on point-to-point link 645 independently from the traffic on point-to-point link 635.

However, interposer device 405 is designed to passively transmit data between a processor and at least one I/O device. Therefore, according to a particular embodiment, interposer device 405 does not include the pin that activates voltage regulator 675. Instead, interposer device 405 interconnects the power domains of voltage regulators 670 and 675 such that both power domains are controlled by voltage regulator 670. Accordingly, the interposer device 405 can transmit power and data between point-to-point link 635 and point-to-point link 645, thereby providing connectivity between a processor in area 620 and an I/O device disposed in area 650. Interposer device effectively combines point-to-point link 635 and point-to-point link 645 into a single point-to-point link, from the point of view of the processor and the I/O device(s) at the ends of this link.

In the embodiment shown in FIG. 6, the power domain of voltage regulator 675 includes point-to-point link 655 between I/O device areas 650 and 660. In such an implementation, interposer device 405 may be configured to allow voltage regulator 670 to control the voltage on point-to-point link 655.

The process of constructing routing tables is responsive to the presence or absence of interposer device 405. Referring again to FIG. 1, in this example processor 102c has been replaced by interposer device 405. As part of the initialization process, primary processor 102a executes a discovery algorithm that builds up the routing tables in processors 102b and 102d. Primary processor 102a begins this process by identifying all system resources that are responsive to it, i.e., all of the adjacencies. Then, for each such resource (e.g., memory bank 106a and processor 102b), primary processor 102a requests all of the resources "owned by" that resource. In preferred embodiments of the invention, interposer device 405 is not configured to provide a response to primary processor 102a during this process, but instead conveys requests and responses between, e.g., primary processor 102a and I/O 130. Using this information, the primary processor builds the routing tables.

While the invention has been particularly shown and described with reference to specific embodiments thereof, it will be understood by those skilled in the art that changes in the form and details of the disclosed embodiments may be made without departing from the spirit or scope of the invention. For example, while the invention has been described principally with regard to implementations for motherboards having distributed voltage regulators, the interposer devices of the present invention also may be used with motherboards having a common regulator for all of the point-to-point links. Interposer devices used with such motherboards do not need to disable one or more distributed voltage regulators, as described above.

It will be understood that the present invention applies more generally to a wide variety of multi-processor architectures that employ a point-to-point communication infrastructure to facilitate communication among the various nodes in the system. In addition, each of the various aspects of the embodiments described herein may be used in combination with various alternatives of other ones of these aspects without departing from the scope of the invention.

It should also be understood that the various embodiments of the invention may be implemented or represented in a wide variety of ways without departing from the scope of the invention. That is, for example, at least some of the inventions described herein may be represented (without limitation) in software (object code or machine code), in varying stages of compilation, as one or more netlists, in a simulation language, in a hardware description language, by a set of photomasks (e.g., semiconductor or circuit board photomasks), and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS), and device types (e.g., ASICs) suitable for designing and manufacturing the processes and circuits described herein are within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

We claim:

1. An interposer device comprising a plurality of interposer device layers, each interposer device layer substantially corresponding to a motherboard layer of a motherboard configured to accommodate at least two processors in a point-to-point architecture, wherein the interposer device is configured to be disposed in a first socket of the motherboard made to accommodate a first processor and configured to transmit signals between a second processor attached to the motherboard and an input/output device attached to the motherboard.

2. An interposer device comprising a plurality of interposer device layers having first transmission characteristics that are substantially identical to second transmission characteristics of motherboard layers of a motherboard configured to accommodate at least two processors in a point-to-point architecture, wherein the interposer device is configured to be disposed in a first socket of the motherboard made to accommodate a first processor and configured to transmit signals between a second processor attached to the motherboard and an input/output device attached to the motherboard.

3. The interposer device of claim 2, wherein the signals are Hyper Transport signals.

4. The interposer device of claim 2, further comprising a plurality of pins configured to be disposed in a pin field of the first socket.

5. The interposer device of claim 4, wherein each of the plurality of pins is configured to conduct signals between an interposer device layer and a corresponding motherboard layer.

6. The interposer device of claim 4, wherein the pin field includes a first recess configured to receive a first pin of the first processor, thereby activating a first voltage regulator, and wherein no pin of the interposer device is configured to be received by the first recess when the interposer device is properly disposed within the first socket.

7. The interposer device of claim 2, further configured to cause a voltage regulator that controls power on a first link between the interposer device and the second processor to also control power on a second link between the interposer device and the input/output device.

8. A computing device comprising the interposer device of claim 2.

9. The computing device of claim 8, further comprising the motherboard, the second processor and the input/output device.

10. A method of manufacturing at least a portion of a computing device, the method comprising:
configuring a plurality of sockets of a motherboard to receive a plurality of nodes, including processors and input/output devices;
disposing a first processor in a first socket of the motherboard configured to receive the first processor;
disposing an input/output device in a second socket of the motherboard configured to receive the input/output device; and
disposing an interposer device in a third socket of the motherboard configured to receive a second processor, thereby conducting signals between the first processor and the input/output device through the interposer device with interposer device transmission characteristics that are substantially identical to motherboard transmission characteristics.

11. The method of claim 10, wherein the motherboard comprises a plurality of voltage regulators for regulating voltage on a plurality of links between the nodes, further comprising the step of disabling one of the plurality of voltage regulators that controls voltage on a link between the second socket and the third socket.

12. A computing device, comprising:
a motherboard comprising:
   a plurality of sockets to receive a plurality of nodes, including processors and input/output devices; and
   a plurality of links for communication between the nodes;
a first processor disposed in a first socket of the motherboard;
an input/output device disposed in a second socket of the motherboard; and
an interposer device in a third socket of the motherboard, the interposer device configured to conduct signals between the first processor and the input/output device, the interposer device having first layers with first transmission characteristics that match second transmission characteristics of corresponding second layers of the motherboard.

13. The computing device of claim 12, wherein the motherboard further comprises a plurality of voltage regulators, each voltage regulator configured to control power in a power domain, and wherein the interposer device is further configured to enable one of the plurality of voltage regulators to extend its power domain.

* * * * *